(12) United States Patent  
Suenaga et al.

(10) Patent No.: US 8,067,702 B2
(45) Date of Patent: Nov. 29, 2011

(54) ELECTROMAGNETIC WAVE SHIELDING MATERIAL AND PRODUCTION PROCESS OF THE SAME

(75) Inventors: Wataru Suenaga, Tokyo (JP); Atsushi Okada, Moriyama (JP); Kohtaro Tanimura, Moriyama (JP)

(73) Assignees: Gunze Limited, Kyoto (JP); DIC Corporation, Tokyo (JP)

( * ) Notice: Subject to any disclaimer, the term of this patent is extended or adjusted under 35 U.S.C. 154(b) by 1033 days.

(21) Appl. No.: 11/916,209

(22) PCT Filed: May 26, 2006

(86) PCT No.: PCT/JP2006/310559
§ 371 (c)(1),
(2), (4) Date: Nov. 30, 2007

(87) PCT Pub. No.: WO2006/129568
PCT Pub. Date: Dec. 7, 2006

(65) Prior Publication Data
US 2010/0018765 A1    Jan. 28, 2010

(30) Foreign Application Priority Data
Jun. 3, 2005   (JP) ................................. 2005-163605

(51) Int. Cl.
*H05K 9/00* (2006.01)
(52) U.S. Cl. ......... 174/389; 174/392; 428/323; 427/109
(58) Field of Classification Search .................. 174/389, 174/392; 428/323; 313/313; 427/108, 109
See application file for complete search history.

(56) References Cited

U.S. PATENT DOCUMENTS

| | | | |
|---|---|---|---|
| 6,207,266 B1 | 3/2001 | Kanbara et al. | |
| 6,399,879 B1 | 6/2002 | Ueda et al. | |
| 6,717,048 B2 | 4/2004 | Ueda et al. | |
| 7,037,594 B2* | 5/2006 | Kojima et al. | 428/601 |
| 7,374,822 B2* | 5/2008 | Nakabeppu et al. | 428/483 |
| 7,378,478 B2* | 5/2008 | Eu et al. | 526/317.1 |
| 7,736,693 B2* | 6/2010 | Garbar et al. | 427/180 |
| 2007/0242177 A1* | 10/2007 | Lee et al. | 349/42 |
| 2008/0012943 A1* | 1/2008 | Watanabe et al. | 348/207.1 |

FOREIGN PATENT DOCUMENTS

| | | |
|---|---|---|
| EP | 1758443 A1 | 2/2007 |
| JP | 02-307202 | 12/1990 |
| JP | 03-034211 | 2/1991 |
| JP | 11-026984 | 1/1999 |
| JP | 11-212277 | 8/1999 |
| JP | 11-319538 | 11/1999 |

(Continued)

*Primary Examiner* — Hung Ngo
(74) *Attorney, Agent, or Firm* — McDermott Will & Emery LLP

(57) ABSTRACT

The production process of an electromagnetic wave shielding material of the present invention comprises screen printing a conductive paste containing conductive particles, binder and solvent in a geometrical pattern on the surface of a transparent porous layer of a transparent resin substrate provided with the transparent porous layer, the porous layer containing as a main component thereof at least one type selected from the group consisting of an oxide ceramic, a non-oxide ceramic and a metal, followed by forming a conductive portion in a geometrical pattern on the surface of the transparent porous layer by heat treatment. An electromagnetic wave shielding material produced according to this production process has high electromagnetic wave shielding effects and superior transparency and visibility.

20 Claims, 3 Drawing Sheets

FOREIGN PATENT DOCUMENTS

| | | |
|---|---|---|
| JP | 2001-196784 | 7/2001 |
| JP | 2001-217589 | 8/2001 |
| JP | 2002-57490 | 2/2002 |
| JP | 2002-167603 | 6/2002 |
| JP | 2002-271086 | 9/2002 |
| JP | 2004-006502 | 1/2004 |
| JP | 2004-006776 | 1/2004 |
| JP | 2004-143546 | 5/2004 |
| JP | 2004-303765 | 10/2004 |
| JP | 2004-312014 | 11/2004 |
| JP | 2005-097643 | 4/2005 |
| JP | 2005-113177 | 4/2005 |
| WO | 2005/115070 | 12/2005 |
| WO | 2006/057348 | 6/2006 |

* cited by examiner

ELECTROMAGNETIC WAVE SHIELDING MATERIAL AND PRODUCTION PROCESS OF THE SAME

CROSS-REFERENCE TO PRIOR APPLICATION

This is a U.S. National Phase Application under 35 U.S.C. §371 of International Patent Application No. PCT/JP2006/310559 filed May 26, 2006, which claims the benefit of Japanese Patent Application No. 2005-163605 filed Jun. 3, 2005, both of them are incorporated by reference herein. The International Application was published in Japanese on Dec. 7, 2006 as WO 2006/129568 A1 under PCT Article 21(2).

TECHNICAL FIELD

The present invention relates to an electromagnetic wave shielding material for blocking electromagnetic waves generated by electronic equipment such as a CRT or PDP, and to a production process thereof.

BACKGROUND ART

Various types of articles have conventionally been produced by forming an electrically conductive or magnetic pattern on a substrate and utilizing the electrical properties or magnetic properties and so forth thereof. Among these, electromagnetic shielding plates are widely used as front panels installed on the front of displays to block electromagnetic waves escaping from the front of CRT, PDP and other display units. In addition to having a function that blocks electromagnetic waves, electromagnetic shielding plates used as front panels are also required to not lower the visibility of the display surface of the display.

A reported example of an electromagnetic shielding material provided with both visibility and electromagnetic shielding is an electromagnetic shielding material that uses an electrically conductive powder and a binder, and has a conductive portion formed by screen printing on the surface of a transparent resin substrate (see Patent Documents 1 and 2).

However, in the case of typically forming a shielding layer in a lattice pattern using screen printing, there is susceptibility to the occurrence of printing problems such as Moire interference caused by interference with the mesh of a printed board or interruption or broadening of fine lines, thereby making precision printing difficult. Consequently, this frequently led to problems such as a decrease in electromagnetic wave shielding performance or decreased visibility.

[Patent Document 1] Japanese Unexamined Patent Application, First Publication No. H11-26984

[Patent Document 2] Japanese Unexamined Patent Application, First Publication No. 2001-196784

DISCLOSURE OF THE INVENTION

Problems to be Solved by the Invention

An object of the present invention is to provide an electromagnetic wave shielding material having superior electromagnetic wave shielding effects, transparency and visibility, and a process for easily and inexpensively producing said electromagnetic wave shielding material.

Means for Solving the Problems

As a result of conducting extensive research to solve the aforementioned problems, the inventors of the present invention found that by screen printing a specific conductive paste in a geometrical pattern on a transparent porous layer, having as a main component thereof at least one type selected from the group consisting of an oxide ceramic, a non-oxide ceramic and a metal, on a transparent resin substrate provided with said transparent porous layer, a conductive portion can be formed on the surface of said transparent porous layer in a geometrical pattern that is without hardly any interruption or broadening of fine lines, and an electromagnetic wave shielding material can be produced having superior electromagnetic wave shielding, a high numerical aperture (visibility) and transparency. The present invention was completed by conducting further studies on the basis of this finding.

Namely, the present invention provides the following electromagnetic wave shielding material and production process thereof.

(1) A production process of an electromagnetic wave shielding material comprising: screen printing a conductive paste containing conductive particles, binder and solvent in a geometrical pattern on the surface of a transparent porous layer of a transparent resin substrate provided with the transparent porous layer, said porous layer containing as a main component thereof at least one type selected from the group consisting of an oxide ceramic, a non-oxide ceramic and a metal, followed by forming a conductive portion in a geometrical pattern on the surface of said transparent porous layer by heat-treating said printed transparent resin substrate.

(2) The production process of an electromagnetic wave shielding material described in (1) above, wherein the conductive particles are silver particles having silver oxide coated on the surface thereof.

(3) The production process of an electromagnetic wave shielding material described in (1) above, wherein the method for producing the conductive paste comprises a dispersion step for dispersing a conductive powder in a dispersion solvent in the presence of a surfactant, a drying step for vacuum freeze-drying the liquid dispersion, and a paste formation step for producing a conductive paste having a mass ratio of binder to conductive particles of 0.1 or less by mixing the product of the drying step with a binder and a solvent.

(4) The production process of an electromagnetic wave shielding material described in (1) or (3) above, wherein the transparent resin substrate has a hard coating layer on the opposite side from the transparent porous layer.

(5) The production process of an electromagnetic wave shielding material described in (1) or (3) above, wherein the conductive paste is a conductive paste containing 100 parts by weight of silver particles having silver oxide coated on the surface thereof, 1 to 10 parts by weight of a binder having for a main component thereof at least one type selected from the group consisting of polyester resin, acrylic resin, cellulose resin, urethane resin and copolymer resins thereof, and 1 to 20 parts by weight of a solvent having for a main component thereof at least one type selected from the group consisting of an aromatic hydrocarbon, ketone, glycol ether, glycol ether ester and terpineol.

(6) The production process of an electromagnetic wave shielding material described in (1) above, wherein the thickness of the transparent porous layer is about 0.05 to 20 μm.

(7) The production process of an electromagnetic wave shielding material described in (1) above, wherein the transparent porous layer is composed of an aggregate of fine particles having for a main component thereof at least one type selected from the group consisting of silica, titania and alumina, and has pores between the fine particles.

(8) The production process of an electromagnetic wave shielding material described in (7) above, wherein the mean particle diameter of the fine particles is about 10 to 100 nm, and the pore diameter is about 10 to 100 nm.

(9) The production process of an electromagnetic wave shielding material described in (1) above, wherein the transparent porous layer is formed by one type of method selected from the group consisting of gravure coating, offset coating, comma coating, die coating, slit coating, spray coating, plating, a sol-gel method, LB film method, chemical vapor deposition (CVD), vapor deposition, sputtering and ion plating.

(10) The production process of an electromagnetic wave shielding material described in (1) above, wherein the temperature of the heat treatment is about 130 to 200° C.

(11) The production process of an electromagnetic wave shielding material described in (1) above, wherein the resin of the transparent resin substrate is at least one type selected from the group consisting of polyester resin, polycarbonate resin, poly(meth)acrylic acid ester resin, silicone resin, cyclic polyolefin resin, polyarylate resin and polyethersulfone resin.

(12) The production process of an electromagnetic wave shielding material described in (1) above, wherein the transparent resin substrate is in the form of a sheet, film or plate.

(13) An electromagnetic wave shielding material produced according to the production process described in (1) above.

(14) The electromagnetic wave shielding material described in (13) above, wherein the line width of the geometrical pattern of the conductive portion is about 10 to 30 μm, and the numerical aperture is about 80 to 95%.

(15) A film-like electromagnetic wave shielding material having a conductive portion in a geometrical pattern on a transparent resin substrate; wherein, the total light transmittance is 72 to 91%, the haze value is 0.5 to 6%, the surface resistance value is 5Ω/□ or less, the line width of the geometrical pattern of the conductive portion is about 10 to 30 μm, and the numerical aperture is about 80 to 95%.

(16) An electromagnetic wave shielding filter for a plasma display containing the electromagnetic wave shielding material described in any of (13) to (15) above.

(17) A method for forming a conductive portion in a geometrical pattern on the surface of a transparent porous layer containing as a main component thereof at least one type selected from the group consisting of an oxide ceramic, non-oxide ceramic and metal, comprising: screen printing a conductive paste containing conductive particles, binder and solvent in a geometrical pattern on the surface of said transparent porous layer of a transparent resin substrate provided with said transparent porous layer, followed by heat treatment.

(18) The method described in (17) above, wherein the conductive particles are silver particles having silver oxide coated on the surface thereof.

EFFECTS OF THE INVENTION

In the production process of an electromagnetic wave shielding material of the present invention, a specific conductive paste is screen printed on a transparent porous layer provided on a substrate, said transparent porous layer having as a main component thereof at least one type selected from the group consisting of an oxide ceramic, non-oxide ceramic and metal, thereby allowing the formation of a conductive pattern without hardly any interruption or broadening of fine lines.

In addition, since the conductive paste formed into a pattern can be sintered at a low temperature, whitening and yellowing of the transparent resin substrate can be inhibited and transparency can be maintained. In the case of a transparent resin substrate having a hard coating layer in particular, since the effects of heat and moisture on the substrate can be inhibited by the hard coating during sintering of the conductive paste, even higher transparency can be maintained. Naturally, since screen printing is used in the present invention, the present invention shows advantage in terms of a small number of steps, simplicity and costs, while also having high levels of volume productivity and continuous productivity when producing an electromagnetic wave shielding material.

In addition, since the electromagnetic wave shielding material of the present invention produced according to the production process described above is without hardly any interruption of narrow lines in the conductive pattern, the resistance value is low, high electromagnetic wave shielding effects are demonstrated, and broadening of fine lines can be inhibited, thereby ensuring high numerical aperture (visibility) and transparency.

Thus, the present invention is particularly useful as an electromagnetic wave shielding filter used in displays having a large display screen in the manner of cathode ray tubes (CRT) and plasma display panels (PDP).

BEST MODE FOR CARRYING OUT THE INVENTION

Figure 1:
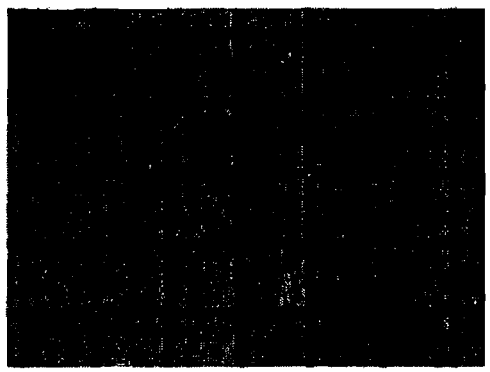
FIG. 1 is a photomicrograph (magnification: ×100) of the lattice lines of a conductive portion in an electromagnetic wave shielding material obtained in Example 1.

The following provides a detailed description of the present invention.

The production process of an electromagnetic wave shielding material of the present invention comprises screen printing a conductive paste containing conductive particles, binder and solvent in a geometrical pattern on the surface of a transparent porous layer of a transparent resin substrate provided with said transparent porous layer, said transparent porous layer containing at least one type of component selected from the group consisting of an oxide ceramic, a non-oxide ceramic and a metal, heat-treating (sintering) the substrate after printing, and forming a conductive portion in a geometrical pattern on the surface of said transparent porous layer.

(Transparent Resin Substrate)

There are no particular limitations on the base resin of the transparent resin substrate used in the present invention provided it allows the formation of said transparent porous layer on said substrate.

Specific examples thereof include polyester resin such as polyethylene terephthalate (PET) or polyethylene naphthalate (PEN); polycarbonate resin; poly(meth)acrylic acid ester resin; silicone resin; cyclic polyolefin resin; polyarylate resin; and polyethersulfone resin. Among these, polyester resin (and particularly PET or PEN) and cyclic polyolefin resin are used preferably based on overall judgment from the viewpoints of transparency, cost, durability, heat resistance and the like.

Here, there are no particular limitations on the transparency in the transparent resin substrate provided it is transparency to a degree that permits used in PDP, CRT and other display applications. Normally, total light transmittance as measured according to JIS K7105 is about 85 to 90%, and haze value as measured according to JIS K7105 is about 0.1 to 3%.

A shape used for PDP, CRT and other displays, namely, a film, sheet or plate and the like is used for the shape of the transparent resin substrate. This shape can be produced from the aforementioned base resin in accordance with known methods.

A film having for a main component thereof a cyclic olefin-based resin is preferable as the aforementioned transparent resin substrate since it shows low moisture absorptivity and water vapor permeability and is provided with physical properties such as high light transmittance. Cyclic olefin-based resins is an ordinary generic term, while specific examples include (a) polymers in which a ring-opening (co)polymer of a cyclic olefin is hydrogenated as necessary, (b) addition (co)polymers of cyclic olefins, (c) random copolymers of cyclic olefins and α-olefins (such as ethylene and propylene), and (d) graft modified forms in which (a) to (c) above have been modified with an unsaturated carboxylic acid or derivative thereof. There are no particular limitations on the cyclic olefin, and examples include norbornene, tetracyclododecene and derivatives thereof (such as those having a carboxyl group or ester group).

Various types of known additives, such as UV absorber, inorganic or organic anti-blocking agents, lubricants, antistatic agents and stabilizers may be added to the cyclic olefin resin according to the purpose of use.

There are no particular limitations on the method for obtaining a film from the cyclic olefin resin, and examples include solution casting, extrusion and calendering.

Examples of solvents used for solvent casting include alicyclic compounds such as cyclohexane, cyclohexene or cyclohexanone (alicyclic hydrocarbons and derivatives thereof), aliphatic compounds such as methyl isobutyl ketone (aliphatic hydrocarbons and derivatives thereof), and aromatic compounds such as toluene, xylene or ethylbenzene (aromatic hydrocarbons and derivatives thereof).

The transparent resin substrate of the present invention has a transparent porous layer containing as a main component thereof at least one type selected from the group consisting of an oxide ceramic, non-oxide ceramic and metal.

Here, examples of oxide ceramics include simple oxides such as titania, alumina, magnesia, beryllia, zirconia or silica; silicates such as silica, forsterite, steatite, wollastonite, zircon, mullite, cordierite or spodumene; and multiple oxides such as aluminum titanate, spinel, apatite, barium titanate, PZT, PLZT, ferrite or lithium niobate.

Examples of non-oxide ceramics include nitrides such as silicon nitride, sialon, aluminum nitride, boron nitride or titanium nitride; carbides such as silicon carbide, boron carbide, titanium carbide or tungsten carbide; and carbons such as amorphous carbon, graphite, diamond, or single crystal sapphire. Other examples include borides, sulfides and silicides.

Examples of metals include gold, silver, iron, copper and nickel.

At least one of these may be used as a raw material, silica, titania and alumina are used preferably, and there are no particular limitations on other components or blending.

The method for forming the transparent porous layer on the transparent resin substrate may be a wet process or a dry process, and although there are no particular limitations thereon, a wet process is preferable on the basis of productivity and cost. In the case of a wet process, the transparent porous substrate may be coated onto the substrate by a known technique. Examples of coating methods include gravure coating, offset coating, comma coating, die coating, slit coating, spray coating, plating, a sol-gel method and an LB film method, with a sol-gel method being preferable. Examples of starting raw materials when using a sol-gel method in the case of silica include tetraethoxysilane, methyltriethoxysilane and tetrachlorosilane, while examples in the case of alumina include aluminum tri-sec-butoxide and aluminum (III) 2,4-pentanedionate. Although the aforementioned starting raw materials promote the sol-gel reaction in the presence of a catalyst and water, hydrolysates (reaction intermediates) thereof, for which the sol-gel reaction has already proceeded, may also be used as starting raw materials. In addition, other components such as a resin or surfactant may also be suitably added as necessary.

Furthermore, examples of dry processes include chemical vapor deposition (CVD), vapor deposition, sputtering and ion plating.

The thickness of the transparent porous layer present on the transparent resin substrate used in the present invention is about 0.05 to 20 μm and particularly about 0.1 to 5 μm.

In addition, the transparent porous layer is composed of an aggregate (coagulate) of fine particles having for a main component thereof at least one type selected from the group consisting of an oxide ceramic, non-oxide ceramic and metal, and has pores between said fine particles. In this transparent porous layer, the mean particle diameter of said fine particles is about 10 to 100 nm and said pore diameter is about 10 to 100 nm. Since the present invention has such a transparent porous layer, it has superior compatibility with a conductive paste to be described later, thereby allowing the formation of a desired pattern.

The shape of the transparent resin substrate having the transparent porous layer is a film, sheet or plate and the like. In the case of a film or sheet, the thickness of the transparent resin substrate having the transparent porous layer is normally about 25 to 200 μm and preferably about 40 to 188 μm. In the case of using as an electromagnetic wave shielding material for the entire display of a PDP and the like in particular, the thickness if preferably about 50 to 125 μm. In addition, in the case of a plate, the thickness is normally about 0.5 to 5 mm and preferably about 1 to 3 mm.

The transparency of the transparent resin substrate having the transparent porous layer is normally such that the total light transmittance as measured according to JIS K7105 is about 85 to 90%, and the haze value as measured according to JIS K7105 is about 0.1 to 3%.

In addition, a hard coating layer may also be provided on the transparent resin substrate used in the present invention on the opposite side from the transparent porous layer.

There are no particular limitations on the hard coating layer and any ordinary material may be used provided it does not impair transparency. Among these, ultraviolet-curable acrylate resins and sol-gel-reacting ceramic films are preferable.

There are no particular limitations on the main component of the aforementioned ultraviolet-curable acrylate resins provided it is an ultraviolet-curable acrylate having two or more functional groups such as polyester acrylate, urethane acrylate or epoxy acrylate. Bifunctional acrylates such as 1,6-hexanediol diacrylate, tripropylene glycol diacrylate, tetraethylene glycol acrylate, 1,9-nonanediol diacrylate, tricyclodecane dimethanol diacrylate, neopentyl glycol PO-modified diacrylate or EO-modified bisphenol A diacrylate, or polyfunctional acrylates such as trimethylolpropane triacrylate, pentaerythritol triacrylate, ditrimethylolpropane tetraacrylate, dipentaerythritol hexaacrylate, trimethylolpropane EO-modified triacrylate, PO-modified glycerin triacrylate or trihydroxyethyl isocyanurate triacrylate are used preferably.

In addition, ultraviolet-curable acrylate resins are ordinarily used by adding a photopolymerization initiator. An adequately cured film can be obtained by adding a photopolymerization initiator such as 1-hydroxycyclohexyl phenyl ketone (Irgacure 184, Ciba Specialty Chemicals Inc.) or 2-hydroxy-2-methyl-1-1-phenyl-propan-1-one. Other examples of photopolymerization initiators that can be used include benzoin, benzoin derivatives, benzophenone, benzophenone derivatives, thioxanthone, thioxanthone derivatives, benzyldimethyl ketal, α-aminoalkylphenone, monoacylphosphine oxide, bisacylphosphine oxide, alkylphenyl glyoxylate, diethoxyacetophenone and titanocene compounds.

The blending ratio of these photopolymerization initiators is preferably 1 to 10 parts by weight to 100 parts by weight of ultraviolet-curable acrylate resin. If the blended amount is less than 1 part by weight, polymerization is not adequately initiated, while if the blended amount exceeds 10 parts by weight, durability may decrease depending on the case.

Furthermore, the aforementioned ultraviolet-curable acrylate resin may also contain a third component (such as a UV absorber or filler) to a degree that does not impair the transparency thereof, and there are no particular limitations thereon.

Examples of starting raw materials of the aforementioned sol-gel-reacting ceramic film in the case of silica include tetraethoxysilane, methyltriethoxysilane and tetrachlorosilane, while examples in the case of alumina include aluminum tri-sec-butoxide and aluminum (III) 2,4-pentanedionate. Although the aforementioned starting raw materials promote the sol-gel reaction in the presence of a catalyst and water, hydrolysates (reaction intermediates) thereof, for which the sol-gel reaction has already proceeded, may also be used as starting raw materials. In addition, other components such as a resin or surfactant may also be suitably added as necessary.

There are no particular limitations on the method for forming a hard coating layer on the transparent resin substrate provided a typical coating method is used.

As a result of providing a hard coating layer on the transparent resin substrate, whitening and yellowing caused by precipitation of oligomers from the resin can be suppressed during sintering to be described later, thereby ensuring a high level of transparency for the electromagnetic wave shielding material of the present invention. In addition, this also enables scratching to be prevented in the production process of the electromagnetic wave shielding material.

(Conductive Paste)

The conductive paste used in the present invention contains conductive particles, a binder and a solvent. This conductive paste is produced by a process comprising a dispersion step for dispersing a conductive powder in a dispersion solvent in the presence of a surfactant, a drying step for vacuum freeze-drying the liquid dispersion, and a paste formation step for producing a conductive paste having a mass ratio of binder to conductive particles of 0.1 or less by mixing the product of the drying step with a binder and a solvent.

(Conductive Particles)

A powder of a metal having an ordinary conductivity can be used without any particular limitations for the conductive particles contained in the conductive paste, examples of which include nickel, copper, gold, silver, aluminum, chromium, platinum, palladium, tungsten, molybdenum, alloys of two or more types thereof and compounds of these metals having satisfactory electrical conductivity.

Silver particles, silver compound particles and silver particles having silver oxide coated on the surface thereof (to also be referred to as "silver oxide-coated silver particles") are preferable for use as conductive particles since they allow stable conductivity to be realized easily while also having favorable thermal conduction properties.

Pure silver particles, metal particles having silver coated on the surface thereof or mixtures thereof can be used for the silver particles used in the present invention. There are no particular limitations on the shape of these silver particles, and those in the shape of spheres, flakes, needles, branches or any arbitrary shape can be used. There are also no particular limitations on the method for producing the silver particles, and any arbitrary method can be used such as mechanical crushing, reduction, electrolysis or a vapor phase method. Metal particles having silver coated on the surface thereof have a coated layer of silver formed by a method such as plating on the surface of particles composed of a metal other than silver. When using as silver particles, spherical silver particles and scale-like silver particles comprised of silver only are preferable from the viewpoints of conductivity and cost.

The volume mean particle diameter of the silver particles and the like is preferably 0.05 to 10 μm and more preferably about 0.05 to 5 μm. When used as silver particles, conductivity of a conductive film may be improved by increasing the bulk density of the silver by combining two or more types of particles having different volume mean particle diameters.

Powders of, for example, silver oxide or silver-containing compounds such as aliphatic silver carboxylates, alicyclic silver carboxylates and aromatic silver carboxylates can be used for the silver compound particles used in the present invention. In addition to those produced industrially, those obtained by a reaction from an aqueous solution containing a silver compound may also be used for the silver compound particles (particulate silver compound). The use of silver compound particles having a mean particle diameter of 0.5 μm or less is particularly preferable due to the faster rate of the reduction reaction. Silver compound particles having a mean particle diameter of 0.5 μm or less can be produced by a method that allows the obtaining of compound silver powder formed by a reaction between a silver compound and another compound such as by dropping an alkaline aqueous solution such as an aqueous sodium hydroxide solution into an aqueous solution of silver nitrate and allowing to react while stirring.

In the present invention, when using silver particles or silver compound particles, it is preferable to use particles that allow the sintering temperature at which they are bonded by heating to be 300° C. or lower, even when considering the decomposition temperature of the binder resin, during production of the polymer-based conductive paste. A conductive paste in which silver particles or silver compound particles are used that have a low sintering temperature in this manner allow a conductor pattern formed on the transparent resin substrate such as a PET film to be sintered as is. In general, the greater the degree to which conductive particles are finely dispersed in the conductive paste, the greater the decrease in the heat capacity of the conductive particles, thereby resulting in the sintering temperature approaching the inherent sintering temperature of the conductive particles. Moreover, as the conductive particles become finely dispersed, the conductive particles more easily adopt a form of maximum bulk density, while the conductivity after sintering is better the more the conductive particles are dispersed.

Moreover, since a conductive paste produced according to the production process of the present invention allows the amount of blended binder to be reduced and the film thickness of the coated film of conductive particles is thin, adjacent particles fuse easily after sintering. Consequently, if silver particles or silver compound particles are used for the conductive paste of the present invention that have a low sintering temperature of 300° C. or lower, inherent low-temperature sintering properties can be adequately demonstrated, and a conductor pattern having satisfactory conductivity can be obtained after sintering.

Silver particles having a volume mean particle diameter of 0.05 to 10 μm can be used for these silver particles and the like having a low sintering temperature. Silver particles having a volume mean particle diameter of 0.05 to 5 μm are used more preferably. In the present invention, in the case of producing a silver powder in a liquid phase, since this highly active silver powder can be surface-treated effectively and in the presence of a surfactant while still in the liquid phase when producing these silver powders and the like, the inherent properties of these silver particles can be adequately demonstrated. Examples of methods for producing silver fine particles include a gas evaporation method (Japanese Unexamined Patent Application, First Publication No. H3-34211) and a reduction-precipitation method that uses an amino compound for reduction (Japanese Unexamined Patent Application, First Publication No. H11-319538).

Moreover, silver particles having a low degree of crystallization can also be used as silver particles having a low sintering temperature. Since crystallite diameter becomes smaller when the degree of crystallization of silver particles is low, the bonding temperature between silver particles can be lowered considerably by reducing crystallite diameter. Crystallite diameter is preferably 20 nm or less, and more preferably 10 nm or less, in order to lower the sinterable temperature of the conductive paste to 300° C. or lower.

In addition, silver particles in which the surface thereof is coated with silver oxide (silver oxide-coated silver particles) can be used as conductive particles having a low sintering temperature. The volume mean particle diameter of silver oxide-coated silver particles contained in the conductive paste is 2 μm or less and preferably about 200 to 500 nm. If silver particles coated with silver oxide are used that have a volume mean particle diameter of 2 μm or less, the particles easily pass through the screen mesh, which together with suppressing interruption and staining of fine lines printed on the transparent porous layer, enables reduction of the silver oxide to preferably occur at a lower temperature.

Silver oxide-coated silver particles have a form in which the surfaces of the silver particles are covered with a silver oxide layer. The content of the silver oxide layer is about 1 to 50% by weight and preferably about 5 to 30% by weight based on the total weight of the silver oxide-coated silver particles. This silver oxide layer fulfills the role of stabilizing the surface of highly active silver fine particles, and preferably suppresses coagulation of silver fine particles in the paste state. In addition, the silver oxide layer is rapidly reduced due to sintering following screen printing, enabling the formation of a conductive portion having high conductivity. There are no particular limitations on the method for producing these silver oxide-coated silver particles, and examples of methods that are used include a method consisting of oxidizing the silver particles themselves, and a method involving mixing silver particles with separately prepared silver oxide.

The silver on the surface of the particles is oxidized to silver (I) oxide, silver (II) oxide and the like by carrying out oxidation treatment on the surfaces of the silver particles. In the silver oxide-coated silver particles, the silver oxide layer on the particle surfaces may be a mixture of silver oxides such as silver (I) oxide and silver (II) oxide. The silver oxide on the surface of these silver oxide-coated silver particles is transformed to silver by a reduction reaction, and adjacent particles are bonded at a low temperature. Silver oxide-coated silver particles having different compositions and shapes can be suitably selected according to such factors as the reduction reaction conditions, heating temperature, presence or absence of reducing agent, and reducing power of the reducing agent.

(Surfactant)

A surfactant selected from numerous types of commonly used surfactants, such as anionic surfactants, nonionic surfactants, cationic surfactants or amphoteric surfactants, can be used for the surfactant used in the production process of the present invention.

Examples of anionic surfactants include alkyl sulfates, polyoxyethylene alkyl sulfate ester salts, alkylbenzene sulfonates, alkylnaphthalene sulfonates, fatty acid salts, salts of naphthalenesulfonic acid-formalin condensation products, polycarboxylic acid-based polymer surfactants, alkenyl succinates, alkanesulfonates, phosphoric acid esters of polyoxyalkylene alkyl ethers and salts thereof, and phosphoric acid esters of polyoxyalkylene alkyl aryl ethers and salts thereof.

Examples of nonionic surfactants include polyoxyethylene alkyl ethers, polyoxyalkylene alkyl ethers, polyoxyethylene derivatives, sorbitan fatty acid esters, polyoxyethylene sorbitan fatty acid esters, polyoxyethylene sorbitol fatty acid esters, glycerin fatty acid esters, polyoxyethylene fatty acid esters, polyoxyethylene hydrogenated castor oil, polyoxyethylene alkyl amines, polyoxyalkylene alkyl amines and alkyl alkanolamides.

Examples of cationic surfactants include alkyl amine salts and quaternary ammonium salts.

Examples of amphoteric surfactants include alkyl betaines and alkyl amine oxides.

Among these surfactants, examples of those that can be particularly preferably used in the present invention include alkyl amine-based, alkyl amine salt-based and phosphate ester-based surfactants.

(Alkyl Amine and Alkyl Amine Salt Surfactants)

Alkyl amines and alkyl amine salts can be preferably used for the surfactant used in the present invention. These are even more effective when using silver particles, silver compound particles or silver oxide-coated silver particles as conductive particles in particular. Although alkyl amine-based nonionic surfactants and alkyl amine salt-based cationic surfactants are effective even if respectively used alone, their combined use in particular is remarkably effective as a result of improving dispersibility.

Polyoxyalkylene alkyl amine-type surfactants are preferable as alkyl amine-based surfactants, while polyoxyethylene alkyl amine-type surfactants are more preferable. In particular, surfactants having the chemical structure (1) shown below are even more preferable.

[Chemical Formula 1]

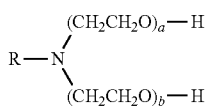
(1)

(In the above formula, a and b are respectively an integer of 1 to 20, and R represents an alkyl group or alkylaryl group having 8 to 20 carbon atoms.)

On the other hand, acetates of alkyl amines are preferable as alkyl amine-based surfactants, while those having the following chemical structure (2) in particular are more preferable.

[Chemical Formula 2]

(2)

(In the above formula, R represents an alkyl group or alkylaryl group having 8 to 20 carbon atoms.)

In formulas (1) and (2), examples of alkyl groups having 8 to 20 carbon atoms include linear or branched alkyl groups such as an octyl group, nonyl group, decyl group, undecyl group, dodecyl group, lauryl group, tetradecyl group, myristyl group, hexadecyl group, cetyl group, octadecyl group, stearyl group or eicosyl group. Examples of alkylaryl groups having 8 to 20 carbon atoms include an octylphenyl group, nonylphenyl group and dodecylphenyl group. The alkyl portion of these alkylaryl groups may be linear or branched alkyl group.

When using an alkyl amine-based surfactant and alkyl amine salt-based surfactant in the form of a cationic surfactant either alone or as a mixture thereof, the total blended amount of surfactant to conductive particles must be suitably adjusted according to the type of conductive particles. For example, although required to be slightly adjusted according to the type of silver particles, the blended amount with respect to silver particles is preferably 0.01 to 3.00 parts by mass and more preferably 0.05 to 1.50 parts by mass to 100 parts by mass of silver particles. If the total blended amount of surfactant is less than 0.01 parts by mass, it tends to be difficult to obtain adequate dispersion. On the other hand, if the total blended amount exceeds 3.00 parts by mass, the surface of the sliver particles is thickly coated by surfactant, making it difficult to obtain contact between silver particles after drying, which in turn tends to lower the conductivity of the conductive paste.

In the case of combining the use of an alkyl amine-based surfactant and alkyl amine salt-based cationic surfactant, the mixing ratio between the alkyl amine-based surfactant and the alkyl amine salt-based surfactant is preferably within the range of 1:20 to 1:5.

(Phosphate Ester-Based Surfactants)

Phosphate ester-based surfactants can also be preferably used as a surfactant used in the present invention. The use of such a surfactant is even more effective when using silver particles, silver compound particles or silver oxide-coated silver particles as conductive particles in particular.

Phosphate ester-based surfactants used in the present invention are surfactants having for a main component thereof a phosphate monoester or phosphate diester and the like. The phosphate ester-based surfactants serving as a main component are preferably phosphate esters of a polyoxyalkylene alkyl ether, and more preferably those having the chemical structure represented by general formula (3) shown below.

[Chemical Formula 3]

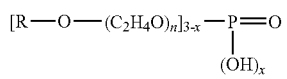
(3)

(In formula (3), R represents an alkyl group or alkylaryl group having 1 to 20 carbon atoms, n represents an integer of 1 to 20, and x is 1 or 2.)

In formula (3), examples of alkyl groups having 1 to 20 carbon atoms include linear or branched alkyl groups such as a methyl group, ethyl group, propyl group, isopropyl group, butyl group, pentyl group, hexyl group, heptyl group, octyl group, nonyl group, decyl group, undecyl group, dodecyl group, lauryl group, tetradecyl group, myristyl group, hexadecyl group, cetyl group, octadecyl group, stearyl group or eicosyl group. Examples of alkylaryl groups having 20 or fewer carbon atoms include a octylphenyl group, nonylphenyl group and dodecylphenyl group. The alkyl portion of these alkylaryl groups may be a linear or branched alkyl group.

Furthermore, the number of carbon atoms of R is preferably 1 to 10, n is preferably 1 to 10, and the sum of the number of carbon atoms of R and n is preferably 7 to 15. The weight average molecular weight of the phosphate ester-based surfactant is preferably 100 to 10,000 and more preferably 150 to 5,000. The phosphorous content (P content) of the phosphate ester-based surfactant is preferably 0.5 to 10% and particularly preferably 2 to 6%.

Moreover, a phosphate ester-based surfactant having an HLB of 10 or more is preferably used for the phosphate ester-based surfactant, or the phosphate ester-based surfactant is preferably used after neutralizing the acid value by adding a basic compound.

The type and blended amount of phosphate ester-based surfactant can be suitably selected according to the type of conductive particles. The blended amount of phosphate ester-based surfactant with respect to, for example, silver particles is preferably 0.01 to 3.00 parts by mass, and more preferably 0.05 to 0.50 parts by mass, to 100 parts by mass of silver particles. If the blended amount of surfactant is less than 0.01 parts by mass, it tends to be difficult to obtain adequate dispersion. On the other hand, if the total blended amount exceeds 3.00 parts by mass, the surface of the sliver particles is thickly coated by surfactant, making it difficult to obtain contact between silver particles after drying, which in turn tends to lower the conductivity of the conductive paste.

(Dispersion Solvent)

The dispersion solvent (dispersion medium) used to disperse the conductive particles is selected in consideration of the solubility of the surfactant in that solvent, specific examples of which include lower alcohols such as water, ethanol and isopropyl alcohol, ethylene oxide addition products of alkyl alcohols such as ethylene glycol hexyl ether and diethylene glycol butyl ether, and propylene oxide addition products of alkyl alcohols such as propylene glycol propyl ether. These solvents are not limited to those listed here, and they can be used alone or two or more types can be used as a mixture at the time of use thereof.

Since vacuum freeze-drying is used for the drying method carried out after the dispersion step in the production process of the present invention, a solvent that is easily frozen is preferably selected for use from the aforementioned dispersion solvents, and more specifically, a solvent having a freezing point of −40° C. or higher is preferable.

(Dispersion Step)

In the dispersion step of the process for producing a conductive paste of the present invention, conductive particles and surfactant are added to a dispersion solvent (dispersion medium) followed by applying to a stirrer or disperser to crush the conductive particles into a fine powder together with mixing with surfactant.

In this manner, when, for example, silver particles, dispersion solvent and surfactant are mixed at a desired ratio and dispersed with a disperser and the like, a liquid dispersion can be obtained in which silver particles are dispersed in the presence of surfactant. The range of the solid concentration of such a liquid dispersion is preferably 0.5 to 80% and particularly preferably 1 to 50%.

A stirrer or disperser can be suitably selected for use from known stirrers and dispersers to be described later for use as a stirrer or disperser.

Dispersion treatment for the conductive particles and surfactant is preferably carried out by blending the surfactant into the dispersion solvent and completely dissolving followed by blending in the conductive particles.

If dispersed for 0.5 to 4.0 hours after blending, the coagulated conductive particles are broken up into primary particles, and the surfactant reaches adsorption equilibrium with respect to the surface of the conductive particles.

In the present invention, in the case of using a phosphate ester-based surfactant, the liquid dispersion is preferably made to be acidic (for example, pH 1 to 3), while in the case of using an alkyl amine-based or alkyl amine salt-based surfactant, the liquid dispersion is preferably made to be basic (for example, pH 12 to 14). As a result, an interface electric double layer is formed on the surface of the conductive particles with surfactant interposed there between, thereby allowing the obtaining of dispersion stability. In addition, since phosphate ester-based surfactants and alkyl amine-based or alkyl amine salt-based surfactants have opposite charges when their hydrophilic group portions are ionized, either of these surfactants is preferably selected and used so that repulsion acts between particles corresponding to the sign of the surface charge of the conductive particles.

Moreover, in the case of silver oxide-coated silver particles, an alkyl amine-based or alkyl amine salt-based surfactant is preferable, and a conductive paste employing a combination thereof has superior thixotropic properties and thick film forming capability. In addition, in the case of pure silver particles (silver particles in which the surface is not subjected to silver oxide treatment), phosphate ester-based surfactants are preferable, and a conductive paste employing a combination thereof has superior dispersibility in a binder.

(Drying Step)

After having obtained a liquid dispersion in which the conductive particles are dispersed in a dispersion solvent together with surfactant as a result of the aforementioned dispersion step, the dispersion solvent is removed from the liquid dispersion by using a vacuum freeze-drying method.

In the vacuum freeze-drying method used in the drying step of the present invention, only the dispersion solvent is removed by sublimation from the frozen liquid dispersion basically in a low-temperature state. Namely, since the surfactant is not lost as a result of eluting into the dispersion solvent, nearly all of the surfactant contained in the liquid dispersion is retained following treatment together with the conductive particles.

In the liquid dispersion, in which conductive particles are dispersed in a dispersion solvent and in which a surfactant is dissolved, although the surfactant in the liquid dispersion is localized near the surface of the conductive particles prior to carrying out vacuum freeze-drying, the surfactant is not necessarily adsorbed to the conductive particles. When the dispersion is removed by sublimation by vacuum freeze-drying, there is a high likelihood of the surfactant being able to be taken out while uniformly adsorbed to the surfaces of the conductive particles. Moreover, although there is the risk of the conductive particles mutually coagulating when removing the dispersion solvent by an ordinary method other than vacuum freeze-drying, vacuum freeze-drying enables coagulation of conductive particles to be effectively suppressed, making this treatment extremely efficient. Since surfactant added to the liquid dispersion is completely adhered to the surfaces of the conductive particles in this manner, conductive particles that have been surface-treated (coated) with surfactant are efficiently obtained, thereby making it easy to determine the relationship between the effects of the surfactant and the amount used as well as making it easier to optimize the amount used.

Since molecules of surfactant adsorb to the surface of the conductive particles at the end with the hydrophilic group, the end with the hydrophilic group is facing to the outside from the conductive particles. As a result, affinity for binder is improved thereby resulting in improved dispersion of the surface-treated conductive particles. In addition, mutual coagulation of conductive particles is inhibited and the conductive particles can be maintained in a state of being dispersed in primary particles.

In the case of, for example, a liquid dispersion containing silver particles, water and surfactant, vacuum freeze-drying is carried out pre-freezing to 0° C. or lower at atmospheric pressure followed by controlling the degree of vacuum so that the vacuum theoretically does not exceed a water vapor pressure of 4.5 mmHg (=600 Pa) at 0° C. The vapor pressure is then preferably lowered to 1 mmHg (=133.32 Pa) or lower followed by raising the temperature to the melting point (freezing point) at that vapor pressure in consideration of drying rate and ease of control.

Since the dispersion medium is sublimated, evaporated and dried in a vacuum using a drying method according to a vacuum freeze-drying method in this manner, there is only slight contraction and the organization and structure of the conductive particles surface-treated with surfactant are resistant to damage. In addition, since drying is carried out at a low temperature in a frozen solid state instead of drying by utilizing the migration of water or other liquid components within a sample at high temperatures in the manner of hot air drying, there is hardly any partial component concentration, partial component alteration or deformation as in the case of drying accompanying migration of liquid components, thereby making this method superior.

(Paste Formation Step)

In order to produce a conductive paste using conductive particles having a surfactant adsorbed onto the surface thereof as a result of aforementioned dispersion and drying steps, the surface-treated conductive particles are mixed with a binder and solvent followed by kneading using a suitable disperser.

Examples of binder contained in the conductive paste include polyester resin, acrylic resin, butyral resin, polyvinyl alcohol resin, acetal resin, phenol resin, urea resin, vinyl acetate emulsion, cellulose resin, urethane resin, polyvinyl acetate resin, epoxy resin, melamine resin, alkyd resin, nitrocellulose resin and natural resin. Those resins having good adhesion with the transparent porous layer without invading the transparent porous layer are particularly preferable, examples of which include polyester resin, acrylic resin, cellulose resin, urethane resin and copolymer resins thereof. One type of these resins can be used or two or more types can be used as a mixture. The amount of binder used is about 1 to 20 parts by weight, and preferably 3 to 10 parts by weight, to 100 parts by weight of silver oxide-coated silver particles or other conductive particles.

In addition, there are no particular limitations on the solvent contained in the conductive paste (paste solvent) provided it does not cause a reaction with the silver oxide-coated silver particles or other conductive particles or binder and enables their favorable dispersion. In the case of formulating a paste for screen printing, for example, a solvent is frequently selected that has a comparatively high boiling point (for example, about 100 to 300° C.).

Examples of organic solvents used include aromatic hydrocarbons such as toluene or xylene; ketones such as methyl ethyl ketone, methyl isobutyl ketone or cyclohexanone; ethers of glycols such as ethylene glycol monoethyl ether, ethylene glycol monobutyl ether, diethylene glycol dimethyl ether, triethylene glycol monobutyl ether, propylene glycol monomethyl ether or tripropylene glycol n-butyl ether; ether esters of glycols such as ethylene glycol monoethyl ether acetate, ethylene glycol monomethyl ether acetate, diethylene glycol monobutyl ether acetate, diethylene glycol monoethyl ether acetate (carbitol acetate) or propylene glycol monomethyl ether acetate; and terpineol. The amount of paste solvent used is about 1 to 30 parts by weight, and preferably about 3 to 20 parts by weight, to 100 parts by weight of silver oxide-coated silver particles or other conductive particles.

Secondary coagulation can also be prevented in the conductive paste as necessary by adding a dispersant to satisfactorily disperse the silver oxide-coated silver particles or other conductive particles. Examples of dispersants used include, but are not limited to, cellulose-based polymers such as hydroxypropyl cellulose, water-soluble polymers such as polyvinyl pyrrolidone or polyvinyl alcohol, alkyl amine-based dispersants, alkyl amine salt-based dispersants and phosphate ester-based dispersants. In the case of using a dispersant, the amount used is about 0.1 to 10 parts by weight to 100 parts by weight of the silver oxide-coated silver particles or other conductive particles.

In addition, a plasticizer may be added to the conductive paste as necessary. Although examples of plasticizers used include phthalic acid esters such as di-n-octylphthalate (DOP) or di-n-butylphthalate (DBP), adipate esters, phosphate esters, trimellitate esters, citrate esters, epoxies and polyesters, there are no particular limitations thereon provided the optimum plasticizer is selected based on the binder used. In the case of using a plasticizer, the amount used is about 0.1 to 10 parts by weight to 100 parts by weight of binder.

If a conductive powder surface-treated with surfactant according to the aforementioned dispersion and drying steps is used as a raw material in particular, a conductive paste can be obtained by a simple dispersion treatment such as stirring by adding solvent and binder at the time of use. Namely, since a satisfactory conductive paste can be obtained by carrying out a simple stirring procedure after adding dispersion solvent and binder immediately before printing, only simple equipment is required for the paste preparation equipment provided with the printing apparatus. In addition, dispersion treatment may also be carried out using the dispersion means described below to ensure more reliable dispersion.

Examples of dispersion means that can be used for kneading and dispersion include a two-roll mill, three-roll mill, ball mill, sand mill, pebble mill, tron mill, sand grinder, Segbary attriter, high-speed impeller disperser, high-speed stone mill, high-speed impact mill, kneader, homogenizer and ultrasonic disperser.

Figure 6:
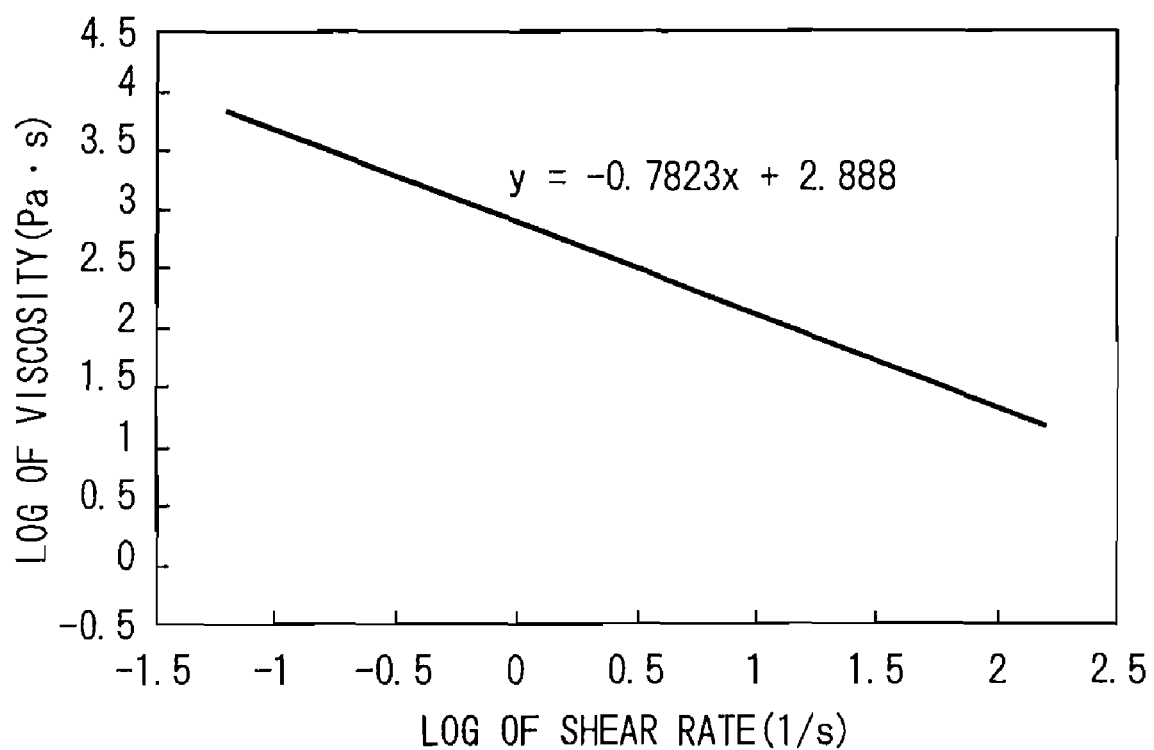
FIG. 6 is a drawing showing an example of a least squares line in a graph showing the relationship between the log of viscosity of and the log of shear rate a conductive paste.

A conductive paste prepared in the manner described above is used for screen printing after having been adjusted to a viscosity and thixotropy suitable for screen printing. Adjustment of viscosity and thixotropy can be carried out by suitably selecting according to the particle diameter of the silver oxide-coated silver particles or other conductive particles, the type of binder, the type of solvent and the like. For example, the viscosity of the conductive paste is normally suitably selected to be within the range of about 10 to 10000 dPa·s, while the thixotropic index is suitably selected to be within the range of about 0.1 to 1.5. Here, thixotropic index is defined as the slope of a least squares line in which the log of shear rate (1/s) is within the range of −1 to 2 in a graph in which the log of viscosity (Pa·s) is plotted on the vertical axis and the log of shear rate (1/s) is plotted on the horizontal axis. For example, in the graph shown in FIG. 6, the least squares line is represented by $y=-0.7823x+2.888$. In this case, the thixotropic index is determined to be 0.7823.

In the case of a conductive paste that uses silver oxide-coated silver particles for the conductive particles, the silver oxide on the particle surfaces is reduced to silver as the paste is cured by heat treatment during sintering. Oxygen released accompanying this reduction reaction oxidizes organic matter of the surrounding surfactant, binder and the like, enabling local generation of heat to be obtained around the particles. As a result, a conductive paste using silver oxide-coated silver particles is able to be bound by heat treatment at a lower temperature (for example, 200° C. or lower) than in the case of using pure silver particles. Thus, a conductive paste using silver oxide-coated silver particles allows requirements with respect to heat resistance of the base material during coating or printing to be lowered, which is particularly preferable in the case of printing onto a resin substrate.

(Electromagnetic Wave Shielding Material)

The electromagnetic wave shielding material of the present invention is produced by screen-printing the aforementioned conductive paste onto the transparent porous layer of the transparent resin substrate followed by heat treatment.

In the present invention, a specific conductive paste is screen-printed onto a predetermined transparent porous layer, and as a result, a conductive pattern is formed that is without hardly any interruption or staining of fine lines.

There are no particular limitations on the method used for screen printing, and screen printing can be carried out using a known method. The screen used for printing is able to effectively block electromagnetic waves, and has a pattern, and particularly a continuous geometrical pattern such as a lattice or mesh, such that a conductive portion is formed to a degree that ensures adequate visibility, an example of which includes a screen in which a lattice pattern having a line width of about 10 to 30 μm and pattern pitch of about 200 to 400 μm is provided on a stainless steel mesh of 360 to 700 mesh woven with stainless steel wire having a diameter of 11 to 23 μm.

Since a conductive paste containing fine particulate silver oxide is used in the screen printing of the present invention, there is hardly any occurrence of pattern unevenness. In addition, due to the favorable compatibility between the conductive paste and the transparent porous layer, there is hardly any occurrence of interruption or staining in the fine lines of a pattern formed on the transparent porous layer.

Although the line width of a screen-printed pattern generally tends to be slightly broader than the line width of the screen in principle, there is hardly any variation in line intervals or pattern distortion, and a pattern can be faithfully reproduced on the transparent porous layer with respect to the pattern of the screen. In cases in which the tendency of line broadening is not desired, the slit width of the screen may be set to be smaller than the line width desired to be formed on the transparent porous layer, and this setting can be easily carried out by a person with ordinary skill in the art.

Continuing, the screen-printed electromagnetic wave shielding material is heat-treated (sintered) at a low temperature of about 130 to 200° C. (and particularly about 160 to 180° C.) to form a conductive portion of a lattice pattern on the transparent porous layer. As previously described, since a specific conductive paste is used, bonding of metal silver particles occurs easily even under comparatively low-temperature heating conditions, thereby allowing the formation of a continuous coated film of silver metal. An external heating method (such as steam or electrically heated hot air, infrared heater or heat roll) or an internal heating method (such as induction heating, high-frequency heating or resistance heating) is employed in heat treatment. The heating time is normally about 5 to 120 minutes and preferably about 10 to 40 minutes.

Furthermore, the aforementioned heat treatment (sintering) may be carried out in multiple stages. For example, after heat treating for about 10 to 20 minutes at 50 to 60° C. during a first heating stage, heat treatment can be carried out for about 10 to 40 minutes at 160 to 180° C. during a second heating stage. The use of multistage heat treatment enables the solvent to volatilize first, thereby further inhibiting staining.

When a conductive paste as described above is used in this manner, the detrimental effects of heat on the transparent resin substrate can be avoided since a silver layer can be formed at a low temperature and in a short period of time. Namely, whitening of the substrate due to precipitation of oligomer from the transparent resin substrate caused by heat and yellowing of the substrate caused by heat can be inhibited.

In addition, whitening and yellowing of the substrate resin during sintering is further inhibited in the case of having a hard coating layer on the opposite side of the transparent porous layer of the transparent resin substrate.

The electromagnetic wave shielding material of the present invention is produced in the manner previously described. The electromagnetic wave shielding material of the present invention has a high numerical aperture of, for example, 75% or more, and particularly about 80 to 95%. Consequently, a high degree of visibility is achieved. Furthermore, in the present description, numerical aperture refers to the value determined from (surface area B/surface area A)×100 (%) in one lattice pattern of the electromagnetic wave shielding material shown in FIG. 4.

In addition, the line width of the lattice or mesh pattern of the conductive portion is normally about 10 to 30 μm and preferably about 15 to 20 μm. If the line width is less than about 10 μm, it tends to be difficult to produce a geometrical pattern, while if the line width exceeds 30 μm, the pattern tends to be conspicuous, thereby making this undesirable.

Furthermore, the interval (pitch) P between the printed lattice or mesh pattern lines can be suitably selected within a range that satisfies the aforementioned numerical aperture and line width. This is normally within a range of about 200 to 400 μm.

Although the thickness of the fine lines (maximum height of fine lines in the vertical direction from the surface of the transparent porous layer) can be varied according to line width and the like, it is normally about 1 μm or more and particularly about 1 to 30 μm.

Figure 5A:
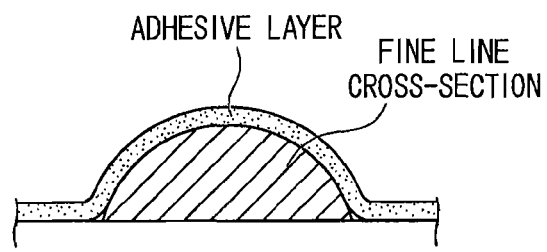
FIG. 5A is a cross-sectional view showing an example in which the cross-section of a fine line of a conductive pattern is in the shape of a semi-circle.
Figure 5B:
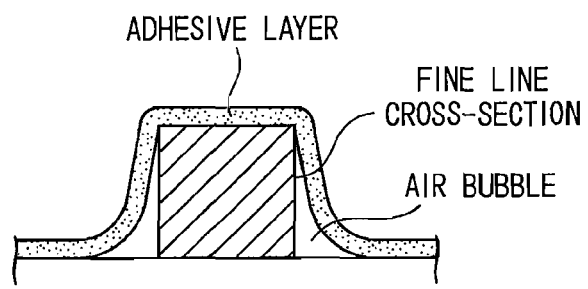
FIG. 5B is a cross-sectional view showing an example in which the cross-section of a fine line of a conductive pattern has a rectangular shape.

In addition, a cross-section of fine lines on the transparent porous layer formed by screen printing has a roughly semicircular shape. In the case of fine lines of patterns formed by previously reported technologies such as lithography or plating and the like, the cross-section of the fine lines is nearly always rectangular. Consequently, air bubbles remain easily when laminating a adhesive layer and the like thereon, thereby having a detrimental effect on visibility (see FIG. 5B). In contrast, since the cross-section of fine lines of the present invention is roughly semicircular, there is a high degree of adhesion when a adhesive layer and the like is laminated thereon, thereby resulting in decreased susceptibility to the formation of residual air bubbles. Consequently, this type of cross-section has the advantage of allowing the obtaining of an electromagnetic wave shielding material having superior visibility (see FIG. 5A).

The electromagnetic wave shielding material of the present invention has high electromagnetic wave shielding effects as well as superior transparency and visibility. Moreover, since there is hardly any interruption of fine lines of the conductive portion, the electromagnetic wave shielding material of the present invention is also characterized by low resistance. The value of surface resistance of the electromagnetic wave shielding material of the present invention is 5Ω/□ or less, preferably 3Ω/□ or less and more preferably 2Ω/□ or less. An excessively large surface resistance is undesirable in terms of shielding characteristics.

Here, the surface resistance value of a shielding material having a conductive pattern can be designed by arbitrarily setting pattern line width and pitch using the equations indicated below.

$$R = Rs \times (P/W)$$

$$Rs = \rho v/t$$

R: Surface resistance of shielding material having a conductive pattern (Ω/□)

Rs: Surface resistance of conductive paste (Ω/□)

ρv: Specific volumetric resistance of conductive paste (Ω·cm)

t: Film thickness of conductive paste

P: Interval (pitch) of lattice or mesh pattern

W: Line width of lattice or mesh pattern

The total light transmittance of the electromagnetic wave shielding material of the present invention (JIS K7105) is able to reach a high value of about 72 to 91%. In addition, the haze value (JIS K7105) is low at about 0.5 to 6%.

Moreover, the majority of the conductive pattern formed in the transparent porous layer is substantially composed of silver particles, and is in the form of a mass of high-purity silver in which silver particles are bonded and joined directly. Consequently, the electromagnetic wave shielding material of the present invention has lower and more stable resistance.

In addition, a protective film may be laminated on the conductive portion formed on the transparent porous layer of the electromagnetic wave shielding material of the present invention. A known resin is typically used for this protective film. These resins are laminated using a known method such as dry lamination or wet lamination.

A functional film may be further laminated on the electromagnetic wave shielding material of the present invention. Examples of functional films include an antireflective film in which an antireflective layer is provided that prevents light from reflecting from the film surface, a near infrared blocking film that absorbs or reflects near infrared light, and an anti-soiling film that prevents fingerprints and other contaminants from adhering to the surface.

The electromagnetic wave shielding material of the present invention has high electromagnetic wave shielding effects as well as superior transparency and visibility. In addition, in a production process using the screen printing method of the present invention, a uniform, conductive geometrical pattern can be easily provided on a substrate with high precision. Consequently, the electromagnetic wave shielding material of the present invention can be easily produced even in the case of an electromagnetic wave shielding front panel applied to a display having a large display surface area. Thus, the electromagnetic wave shielding material of the present invention is useful as an electromagnetic wave shielding filter used in displays having a large display screen such as cathode ray tubes (CRT) and plasma display panels (PDP).

EXAMPLES

Although the following provides a more detailed description of the present invention through comparative examples and examples thereof, the present invention is not limited to these examples.

Conductive Paste Production Example 1

50 g of silver powder FHD (crystallite diameter<10 nm) coated with 10% silver oxide manufactured by Mitsui Mining & Smelting Co., Ltd. having a mean particle diameter of 400 nm, 5 g of a 10% by weight aqueous solution of an alkyl amine salt-based cationic surfactant in the form of coconut amine acetate, 0.5 g of a 10% by mass aqueous solution of an alkyl amine-based surfactant in the form of polyoxyethylene coconut alkyl amine ether, 50 g of a solvent in the form of water, and 40 g of zirconia beads having a diameter of 2 mm were placed in a plastic bottle having a volume of 250 ml and mixed followed by milling for 4 hours using a rotator (ball mill) to obtain silver particle dispersion (a-1).

100 g of this silver particle dispersion (a-1) were transferred to a flat tray having a bottom surface measuring 200 mm long by 150 mm wide followed preliminary freeze-drying and then vacuum freeze-drying. The "DFM-05AS" manufactured by Ulvac Inc. was used for the vacuum freeze-drying apparatus. The pre-frozen silver particle dispersion (a-1) was placed on a shelf pre-cooled to about −40° C. and after vacuum freeze-drying for 20 hours at a degree of vacuum of 7 to 10 Pa, 50 g of surface-treated silver particles (b-1) coated with surfactant were obtained in the form of a high-density sponge-like dried product.

Next, 50 g of the surface-treated silver particles (b-1), 4.17 g of a binder resin (mixture of solvent components consisting of polyol components in the form of "Burnock DE-140-70" (Dainippon Ink & Chemicals, Inc.) and "Burnock DB980" (Dainippon Ink & Chemicals, Inc.) and an isocyanurate prepolymer component in the form of "Burnock DB980K" (Dainippon Ink & Chemicals, Inc.) substituted with carbitol acetate) (solid content: 2.5 g), and 4.2 g of carbitol acetate were placed in a plastic bottle having a volume of 250 ml and mixed followed by mixing and agitating for 0.5 hours using a shaker (paint conditioner) to obtain conductive paste (c-1) of Production Example 1.

Conductive Paste Production Example 2

A silver particle dispersion (a-2) was obtained according to the same method as Production Example 1 with the exception of using 5 g of a 10% by mass aqueous solution of a phosphate ester-based surfactant in the form of a polyoxyalkylene alkyl ether-phosphate ester having a phosphorous content of 4.4%, weight average molecular weight of 1750 and HLB of 12, instead of a mixture of alkyl amine-based surfactant and alkyl amine salt-based surfactant for the surfactant. Next, 50 g of surface-treated silver particles (b-2) were obtained according to the same method as Production Example 1 from this silver particle dispersion (a-2). Moreover, conductive paste (c-2) of Production Example 2 was obtained according to the same method as Production Example 1 from these surface-treated silver particles (b-2).

Example 1

An ultraviolet-curable acrylic hard coating agent (Dainippon Toryo Co., Ltd., product name: "UV Clear", solid content concentration: 50% by weight) was coated onto a transparent resin substrate in the form of a polyethylene terephthlate film transparent substrate (thickness including transparent porous layer: 120 μm, Pictorico Co., Ltd., product name: "TPX") having a transparent porous layer of an alumina film (layer thickness: 20 μm) on the opposite side from the transparent porous layer using a Meyer bar to a post-curing film thickness of 2 μm followed by drying for 2 minutes at 80° C. and irradiating with ultraviolet light at an ultraviolet dosage of 300 mJ/cm² to form a hard coating layer.

A lattice pattern was screen-printed onto the porous layer film surface of said film with a screen printer (Newlong Seimitsu Kogyo Co., Ltd.) using the aforementioned conductive paste (c-1) of Production Example 1 (containing particulate silver (mean particle diameter: 400 nm), of which the surface was treated with 10% silver oxide and alkyl amine-based/alkyl amine salt-based surfactant), polyester-urethane-based binder, and carbitol acetate-based solvent).

The screen used was provided with a lattice-like emulsion pattern having line width of 20 μm, pattern pitch of 250 μm and numerical aperture of 84.6% on 500 mesh stainless steel mesh woven with stainless steel wire having a diameter of 18 μm (manufactured by Nakanuma Art Screen Co., Ltd.).

After printing, the silver compound paste was sintered on the film for 30 minutes at 180° C. to form a conductive pattern in which a square pattern is depicted in the form of a lattice to produce an electromagnetic wave shielding material.

When the lattice lines of the conductive portion of the resulting electromagnetic wave shielding material were observed with a light microscope (magnification: ×100), there were hardly any interruptions of staining (broadening) of the lines (FIG. 1).

Example 2

A liquid sol in which silica fine particles were dispersed (in which silica filler having a particle diameter of 10 to 100 nm was added to an organosiloxane-based sol solution) was deposited on the surface of a transparent resin substrate in the form of a polyethylene terephthalate film (Toyobo Co., Ltd., product name: "A4300") having a thickness of 125 μm to a post-curing film thickness of 1.0 μm followed by drying for 1 minute at 120° C. and aging for 3 days at 60° C. to produce a polyethylene terephthalate film transparent substrate having a silica film transparent porous layer (layer thickness: 1.0 μm). A sol-gel-reacting hard coating layer (containing 1.83 parts of curing agent (Nippon Fine Chemical Co., Ltd., product name: "NSC-CO") to 100 parts of primary agent (Nippon Fine Chemical Co., Ltd., product name: "NSC2451")) was reverse gravure-coated onto the transparent substrate having said transparent porous layer on the opposite side from said transparent porous layer to a post-curing film thickness of 3 μm followed by drying for 2 minutes at 120° C. to form a hard coating layer.

A lattice pattern was screen-printed onto the porous layer film surface of said film with a screen printer (Newlong Seimitsu Kogyo Co., Ltd.) using the aforementioned conductive paste (c-1) of Production Example 2 (containing particulate silver (mean particle diameter: 400 nm), of which the surface was treated with 10% silver oxide and phosphate ester-based surfactant), polyester-urethane-based binder, and carbitol acetate-based solvent).

The screen used was provided with a lattice-like emulsion pattern having line width of 20 μm, pattern pitch of 300 μm and numerical aperture of 87.1% on 400 mesh stainless steel mesh woven with stainless steel wire having a diameter of 23 μm (manufactured by Nakanuma Art Screen Co., Ltd.).

After printing, the silver compound paste was sintered on the film for 30 minutes at 170° C. to form a conductive pattern in which a square pattern is depicted in the form of a lattice to produce an electromagnetic wave shielding material.

Example 3

A cyclic polyolefin film transparent substrate was produced having a silica film transparent porous layer (layer thickness: 1.0 μm) by depositing a liquid sol in which silica fine particles were dispersed (in which silica filler having a particle diameter of 10 to 100 nm was added to an organosiloxane-based sol solution) on the surface of a transparent resin substrate in the form of a cyclic polyolefin film having a thickness of 100 μm (Polyplastics Co., Ltd., product name: "TOPAS6017") to a post-curing film thickness of 1.0 μm followed by drying for 1 minute at 120° C. and aging for 3 days at 60° C. A sol-gel-reacting hard coating layer (containing 1.83 parts of curing agent (Nippon Fine Chemical Co., Ltd., product name: "NSC-CO") to 100 parts of primary agent (Nippon Fine Chemical Co., Ltd., product name: "NSC2451")) was reverse gravure-coated onto the transparent substrate having said transparent porous layer on the opposite side from said transparent porous layer to a post-curing film thickness of 3 μm followed by drying for 2 minutes at 120° C. to form a hard coating layer.

A lattice pattern was screen-printed onto the porous layer film surface of said film with a screen printer (Newlong Seimitsu Kogyo Co., Ltd.) using the aforementioned conductive paste (c-1) (containing particulate silver (mean particle diameter: 400 nm), of which the surface was treated with 10% silver oxide and alkyl amine-based/alkyl amine salt-based surfactant), polyester-urethane-based binder, and carbitol acetate-based solvent).

The screen used was provided with a lattice-like emulsion pattern having line width of 20 μm, pattern pitch of 300 μm and numerical aperture of 87.1% on 400 mesh stainless steel mesh woven with stainless steel wire having a diameter of 23 μm (manufactured by Nakanuma Art Screen Co., Ltd.).

After printing, the silver compound paste was sintered on the film for 30 minutes at 170° C. to form a conductive pattern in which a square pattern is depicted in the form of a lattice to produce an electromagnetic wave shielding material.

Comparative Example 1

An electromagnetic wave shielding material was produced in the same manner as Example 1 with the exception of forming a hard coating layer by coating an ultraviolet-curable acrylic hard coating agent (Dainippon Toryo Co., Ltd., product name: "UV Clear", solid content concentration: 50% by weight) on the readily adhesive surface of a transparent resin substrate in the form of a polyethylene terephthalate film having a thickness of 175 μm and not provided with a transparent porous layer (Toyobo Co., Ltd., product name: "A4100") with a Meyer bar to a post-curing film thickness of 2 μm followed by drying for 2 minutes at 80° C. and irradiating with ultraviolet light at an ultraviolet dosage of 300 mJ/cm$^2$.

Figure 2:
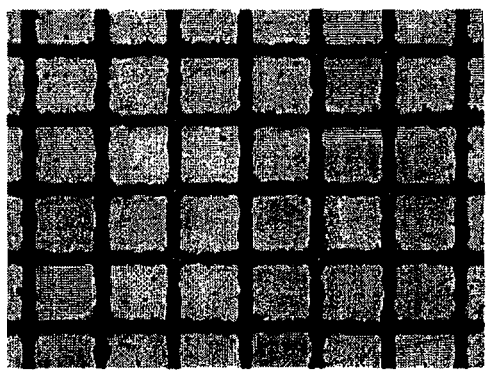
FIG. 2 is a photomicrograph (magnification: ×100) of the lattice lines of a conductive portion in an electromagnetic wave shielding material obtained in Comparative Example 1.

When the lattice lines of the conductive portion of the resulting electromagnetic wave shielding material were observed with a light microscope (magnification: ×100), there were numerous locations where bleeding of the oligomer and staining of the lines had occurred (FIG. 2).

Comparative Example 2

Figure 3:
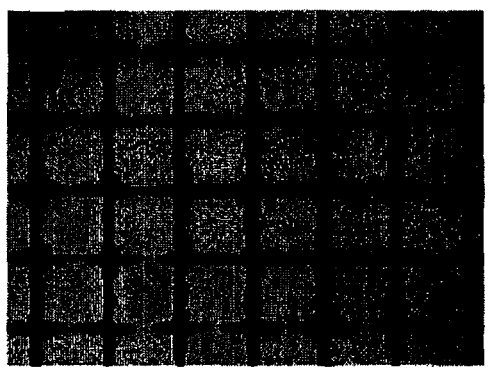
FIG. 3 is a photomicrograph (magnification: ×100) of the lattice lines of a conductive portion in an electromagnetic wave shielding material obtained in Comparative Example 2.

An electromagnetic wave shielding material was produced in the same manner as Example 1 with the exception of using a typical silver paste of the prior art (SW-1100-1 manufactured by Asahi Chemical Research Co., Ltd., composite ratio: silver particles (particle diameter: 3 to 5 μm) 58.0 to 64.0%, carbon powder (primary particle diameter: 0.1 μm or less) 0.8 to 1.2%, polyester resin 11.0 to 14.0%, additives 0.05 to 0.15%, ethyl carbitol acetate (balance), viscosity: 200 to 300 ps (as determined with Viscotester Model VT-04)) instead of the conductive paste (c-1) used in Example 1 (containing particular silver surface-treated with 10% silver oxide, polyester-urethane-based binder and carbitol acetate-based solvent). When the lattice lines of the conductive portion of the resulting electromagnetic wave shielding material were observed with a light microscope (magnification: ×100), there were numerous locations where interruption and staining of the lines had occurred (FIG. 3).

Comparative Example 3

A hard coating layer was formed by coating an ultraviolet-curable acrylic hard coating agent (Dainippon Toryo Co., Ltd., product name: "UV Clear", solid content concentration: 50% by weight) on surface of a transparent resin substrate in the form of a polyethylene terephthalate film having a thickness of 175 μm and not provided with a transparent porous layer (Toyobo Co., Ltd., product name: "A4100") with a Meyer bar to a post-curing film thickness of 2 μm followed by drying for 2 minutes at 80° C. and irradiating with ultraviolet light at an ultraviolet dosage of 300 mJ/cm$^2$.

A lattice pattern was screen-printed onto said film on the opposite side from the hard coating layer with a screen printer (Newlong Seimitsu Kogyo Co., Ltd.) using the aforementioned conductive paste (c-1) (containing particulate silver (mean particle diameter: 400 nm), of which the surface was treated with 10% silver oxide and alkyl amine-based/alkyl amine salt-based surfactant), polyester-urethane-based binder, and carbitol acetate-based solvent).

The screen used was provided with a lattice-like emulsion pattern having line width of 20 μm, pattern pitch of 300 μm and numerical aperture of 87.1% on 400 mesh stainless steel mesh woven with stainless steel wire having a diameter of 23 μm (manufactured by Nakanuma Art Screen Co., Ltd.).

After printing, the silver compound paste was sintered on the film for 30 minutes at 170° C. to form a conductive pattern in which a square pattern is depicted in the form of a lattice to produce an electromagnetic wave shielding material.

Test Example 1

The results of evaluating the electromagnetic wave shielding effects, total light transmittance, haze value, sheet resistance, line width, numerical aperture and line thickness of the electromagnetic wave shielding materials of the aforementioned Examples 1 to 3 and Comparative Examples 1 to 3 were obtained by measuring according to the measurement methods described below. Those results are shown in Table 1.

1. Electromagnetic Wave Shielding Effects

Electromagnetic wave shielding effects were measured with a measuring instrument using the Kansai Electronic Industry Development Center method (commonly referred to as the KEC method).

2. Total Light Transmittance

Total light transmittance was measured with the Model NDH-20D turbidometer (Nippon Denshoku Industries Co., Ltd.) in accordance with JIS K7105.

3. Haze Value

Haze value was measured with the Model NDH-20D turbidometer (Nippon Denshoku Industries Co., Ltd.) in accordance with JIS K7105.

4. Sheet Resistance

Sheet resistance was measured using the Loresta EP (Dia Instruments Co., Ltd.).

5. Line Width

Line width was measured using a light microscope.

6. Numerical Aperture

Figure 4:
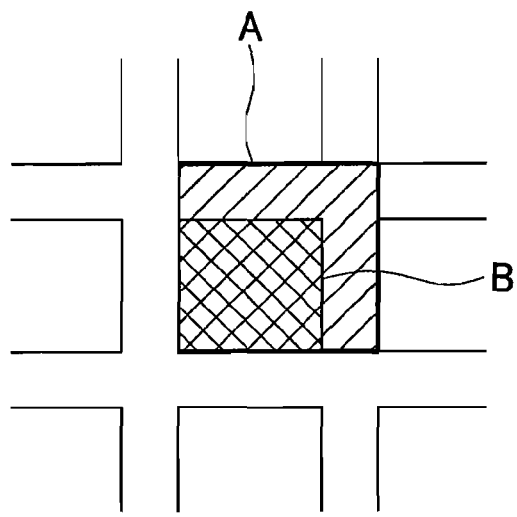
FIG. 4 is a drawing schematically illustrating a method for measuring numerical aperture.

Numerical aperture was determined by measuring the line width and line interval of a single lattice pattern of an electromagnetic wave shielding material using a light microscope, calculating surface area A and surface area B shown in FIG. 4, and then calculating numerical aperture by entering those values into the following equation.

Numerical aperture (%)=(Surface area $B$/Surface area $A$)×100(%)

7. Line Thickness

Line thickness was measured using a surface profiler.

8. Adhesion

Adhesion was evaluated using a tape peeling test. More specifically, an electromagnetic wave shielding material in which 90% or more of the mesh pattern remained when a commercially available cellophane tape (Nichiban Co., Ltd., Cellotape (registered trademark) CT-18, LP-18) was affixed thereto and then peeled off was evaluated as "Good", that in which 50% to less than 90% remained was evaluated as "Fair", and that in which less than 50% remained was evaluated as "Bad".

have high electromagnetic wave shielding effects and superior transparency and visibility.

INDUSTRIAL APPLICABILITY

The electromagnetic wave shielding material of the present invention can be used to block electromagnetic waves generated from electrical equipment such as a CRT of PDP as well as block electromagnetic waves in various fields.

The invention claimed is:

1. A production process of an electromagnetic wave shielding material comprising:
   screen printing a conductive paste containing conductive particles, binder and solvent in a geometrical pattern on the surface of a transparent porous layer of a transparent resin substrate provided with the transparent porous layer, said transparent porous layer containing as a main component thereof at least one type selected from the group consisting of an oxide ceramic, a non-oxide ceramic and a metal, followed by forming a conductive portion in a geometrical pattern on the surface of said transparent porous layer by heat-treating said printed transparent resin substrate.

2. The production process of an electromagnetic wave shielding material according to claim 1, wherein the conductive particles are silver particles having silver oxide coated on the surface thereof.

3. The production process of an electromagnetic wave shielding material according to claim 1, wherein the conductive paste is produced by the method comprising; a dispersion step for dispersing a conductive powder in a dispersion solvent in the presence of a surfactant; a drying step for vacuum freeze-drying the liquid dispersion; and a paste formation step for producing a conductive paste having a mass ratio of binder to conductive particles of 0.1 or less by mixing the product of the drying step with a binder and a solvent.

4. The production process of an electromagnetic wave shielding material according to claim 3, wherein the transparent resin substrate has a hard coating layer on the opposite side from the transparent porous layer.

5. The production process of an electromagnetic wave shielding material according to claim 1, wherein the transparent resin substrate has a hard coating layer on the opposite side from the transparent porous layer.

6. The production process of an electromagnetic wave shielding material according to claim 1, wherein the conductive paste is a conductive paste containing 100 parts by weight of silver particles having silver oxide coated on the surface

TABLE 1

| | Electromagnetic Wave Shielding Effects (dB) | | | Total Light Transmittance | Haze | Sheet Resistance | Line Width | Numerical Aperture | Line Thickness | |
|---|---|---|---|---|---|---|---|---|---|---|
| | 100 MHz | 300 MHz | 500 MHz | (%) | Value | (Ω/□) | (µm) | (%) | (µm) | Adhesion |
| Example 1 | 41 | 43 | 40 | 72.9 | 3.6 | 0.733 | 25.0 | 84.0 | 4.7 | Good |
| Example 2 | 39 | 39 | 39 | 76.5 | 2.3 | 0.474 | 23.2 | 85.1 | 8.9 | Good |
| Example 3 | 38 | 38 | 39 | 74.1 | 2.5 | 0.377 | 24.3 | 84.4 | 8.5 | Good |
| Comparative Example 1 | 35 | 32 | 36 | 54.0 | 5.1 | 0.526 | 58.0 | 59.0 | 1.8 | Bad |
| Comparative Example 2 | 39 | 33 | 33 | 66.5 | 10.3 | 1.672 | 45.9 | 66.7 | 2.0 | Bad |
| Comparative Example 3 | 3 | 3 | 3 | 48.1 | 12.4 | Impossible to measure | 70.3 | 58.6 | 4.4 | Good |

According to Table 1, an electromagnetic wave shielding material obtained in the present invention was determined to thereof, 1 to 10 parts by weight of a binder having for a main component thereof at least one type selected from the group consisting of polyester resin, acrylic resin, cellulose resin, urethane resin and copolymer resins thereof; and 1 to 20 parts by weight of a solvent having for a main component thereof at least one type selected from the group consisting of an aromatic hydrocarbon, ketone, glycol ether, glycol ether ester and terpineol.

7. The production process of an electromagnetic wave shielding material according to claim 6, wherein the conductive paste is a conductive paste containing 100 parts by weight of silver particles having silver oxide coated on the surface thereof, 1 to 10 parts by weight of a binder having for a main component thereof at least one type selected from the group consisting of polyester resin, acrylic resin, cellulose resin, urethane resin and copolymer resins thereof; and 1 to 20 parts by weight of a solvent having for a main component thereof at least one type selected from the group consisting of an aromatic hydrocarbon, ketone, glycol ether, glycol ether ester and terpineol.

8. The production process of an electromagnetic wave shielding material according to claim 1, wherein the thickness of the transparent porous layer is about 0.05 to 20 μm.

9. The production process of an electromagnetic wave shielding material according to claim 1, wherein the transparent porous layer is composed of an aggregate of fine particles 10 having for a main component thereof at least one type selected from the group consisting of silica, titania and alumina, and has pores between the fine particles.

10. The production process of an electromagnetic wave shielding material according to claim 9, wherein the mean particle diameter of the fine particles is about 10 to 100 nm, and the pore diameter is about 10 to 100 nm.

11. The production process of an electromagnetic wave shielding material according to claim 1, wherein the transparent porous layer is formed by one type of method selected from the group consisting of gravure coating, offset coating, comma coating, die coating, slit coating, spray coating, plating, a sol-gel method, LB film method, chemical vapor deposition (CVD), vapor deposition, sputtering and ion plating.

12. The production process of an electromagnetic wave shielding material according to claim 1, wherein the temperature of the heat treatment is about 130 to 200° C.

13. The production process of an electromagnetic wave shielding material according to claim 1, wherein the resin of the transparent resin substrate is at least one type selected from the group consisting of polyester resin, polycarbonate resin, poly(meth)acrylic acid ester resin, silicone resin, cyclic polyolefin resin, polyarylate resin and polyethersulfone resin.

14. The production process of an electromagnetic wave shielding material according to claim 1, wherein the transparent resin substrate is in the form of a sheet, film, or plate.

15. An electromagnetic wave shielding material produced according to the production process according to claim 1.

16. The electromagnetic wave shielding material according to claim 15, wherein the line width of the geometrical pattern of the conductive portion is about 10 to 30 μm, and the numerical aperture is about 80 to 95%.

17. The electromagnetic wave shielding material according to claim 15, comprising a conductive portion in a geometrical pattern on a transparent resin substrate; wherein, the total light transmittance is 72 to 91% the haze value is 0.5 to 6%, the surface resistance value is 5Ω/□ or less, the line width of the geometrical pattern of the conductive portion is about 10 to 30 μm, and the numerical aperture is about 80 to 95%.

18. An electromagnetic wave shielding filter for a plasma display comprising the electromagnetic wave shielding material according to claim 15.

19. A method for forming a conductive portion in a geometrical pattern on the surface of a transparent porous layer containing as a main component thereof at least one type selected from the group consisting of an oxide ceramic, non-oxide ceramic and metal, comprising; screen printing a conductive paste containing conductive particles, binder and solvent in a geometrical pattern on the surface of said transparent porous layer of a transparent resin substrate provided with said transparent porous layer, followed by heat treatment.

20. The method according to claim 19, wherein the conductive particles are silver particles having silver oxide coated on the surface thereof.

\* \* \* \* \*